United States Patent [19]
Shim et al.

[11] Patent Number: 6,020,218
[45] Date of Patent: Feb. 1, 2000

[54] METHOD OF MANUFACTURING BALL GRID ARRAY SEMICONDUCTOR PACKAGE

[75] Inventors: Il Kwon Shim, Seoul; Sun Ho Ha, Kyungki-Do, both of Rep. of Korea

[73] Assignees: ANAM Semiconductor Inc., Seoul, Rep. of Korea; Amkor Technology, Inc., Chandler, Ariz.

[21] Appl. No.: 09/013,330

[22] Filed: Jan. 26, 1998

[30] Foreign Application Priority Data

Jan. 28, 1997 [KR] Rep. of Korea .......................... 97-2504

[51] Int. Cl.[7] ...................................................... H01L 21/44
[52] U.S. Cl. ............................. 438/111; 438/123; 438/126
[58] Field of Search ..................................... 438/110, 111, 438/112, 113, 121, 123, 125, 126, 107

[56] References Cited

U.S. PATENT DOCUMENTS

| | | | |
|---|---|---|---|
| 5,262,351 | 11/1993 | Bureau et al. ........................... | 438/107 |
| 5,289,346 | 2/1994 | Carey et al. .............................. | 438/127 |
| 5,426,072 | 6/1995 | Finnila .................................... | 438/107 |
| 5,474,957 | 12/1995 | Urushima ................................ | 438/122 |
| 5,527,741 | 6/1996 | Cole et al. ................................ | 438/107 |
| 5,548,099 | 8/1996 | Cole, Jr. et al. ......................... | 438/107 |

*Primary Examiner*—Kevin Picardat
*Attorney, Agent, or Firm*—Skjerven, Morrill, MacPherson, Franklin & Friel, LLP; Thomas S. MacDonald

[57] ABSTRACT

Provided with a method of manufacturing a ball grid array semiconductor package using a flexible circuit board strip, which is directed to prevent minute conductive traces in the outer part of a circuit pattern formed in the flexible circuit board and thus minimize the short-circuits by forming notches on the flexible circuit board in the vicinity of the lower side ends of a resin encapsulant section by use of a punch, and pressing down the resin encapsulant section with a singulation tool to remove the carrier frame and separate the ball grid array semiconductor packages in the piece.

19 Claims, 14 Drawing Sheets

METHOD OF MANUFACTURING BALL GRID ARRAY SEMICONDUCTOR PACKAGE

BACKGROUND OF THE INVENTION

1. Field of the Invention

The present invention relates to a method of manufacturing a BGA (Ball Grid Array) semiconductor package and, more particularly, to a method of manufacturing a BGA using a flexible circuit board.

2. Discussion of Related Art

As a rule, 'semiconductor package' refers to an electronic device provided with I/O terminals for the transmission of signals to a main board by using, for example, lead frame, PCB (Printed Circuit Board), flexible circuit board, or the like and encapsulated with an encapsulant in order to protect a semiconductor chip, e.g., single device and/or integrated circuitry having all sorts of electronic circuits and/or wirings against unfavorable environments such as dusts, moisture, external shock, or electrical or mechanical load and also to achieve an optimization of the semiconductor chip's performance.

Such semiconductor packages are in the rapid development for high integration, miniaturization and high performance with the trends of producing electronic devices of high performance and miniaturization and, therefore, surface built-in semiconductor packages such as SOJ (Small Outline J-leaded Package) or QFP (Qquad Flat Package) are widely used for the resin encapsulated semiconductor packages using lead frames. Recently, the use of printed circuit boards or flexible circuit boards in a ball grid array semiconductor package can maximize the number of input/output terminals and increase the built-in density in a main board, contributing to the miniaturization and high performance of semiconductor packages.

Generally speaking, such a ball grid array semiconductor package has one or more semiconductor chips mounted on a PCB, and an array of solder balls disposed in the opposite position to the PCB with the semiconductor chip attached thereon and providing an electrical connection with respect to the conductive material such as main board. Ball grid array semiconductors having such a structure are widely used in a multi-pin device above 200 pins, VLSI (Very Large-Scale Integrated) circuits, micro processors, and the like.

The ball grid array semiconductor package, however, has very high heat resistance due to the PCB's thickness of at least a several hundreds of microns, thus deteriorated by a heat generated during the operation of the mounted semiconductor chip, unsatisfactory in the requirements for lightweighted and thin devices, and needed to form a solder mask to cover the whole PCB and its circuit patterns for the purpose of insulating the circuit patterns exposed out of the encapsulant section. For a multi-structured PCB, it is necessary to form via holes for electrical connections between upper and lower circuit patterns, increasing the complexity of process and the production cost.

The example of FIG. 3 is substantially similar to the structure of a semiconductor package using a conventional flexible circuit board. With reference to FIG. 3, the semiconductor package comprises a semiconductor chip 20 having laminated electronic circuits and/or wirings and plural I/O pads 10a formed on the surface; a flexible circuit board 40' having a circuit pattern 42 which is formed on a flexible resin film 41 with an adhesive coating 30 coated on the lower surface a semiconductor chip 20 and includes a plurality of conductive traces having fingers 43 and conductive ball lands 44 as I/O terminals, the semiconductor chip 20 being mounted on the center of the flexible circuit board 40' with adhesive coating 30; conductive wires 50 for electrically connecting the I/O pads 10a of the semiconductor chip 20 to the bond fingers 43 of the flexible circuit board 40'; a resin encapsulant section 60 for protecting semiconductor chip 20 and conductive wires 50 against external environments; and conductive balls 70 adhesively fused to the conductive ball lands 44 electrically connected to the circuit pattern 42 of the flexible circuit board 40', and functioning as I/O terminals to a main board.

However, in a method of the ball grid array semiconductor package using the flexible circuit board according to prior art, the metal carrier frame with the flexible circuit board attached thereon must be cut by means of punch or cutter in the step of singulation to separate a plurality of ball grid array semiconductor packages in the piece formed on a single strip for the process efficiency, thereby producing deflection or damages on the minute conductive traces positioned in the outer part of circuit patterns formed on the flexible circuit board, with consequence of short-circuits.

It is therefore an increasing trend to manufacture a ball grid array semiconductor package using a flexible circuit board wherein circuit patterns are formed on a very thin, flexible resin film, instead of using a PCB board that has a relatively large thickness.

SUMMARY OF THE INVENTION

Accordingly, the present invention is directed to a method of manufacturing a ball grid array semiconductor package that substantially obviates one or more of the problems due to limitations and disadvantages of the related art.

A first objective of the present invention is to provide a method of manufacturing a ball grid array semiconductor package, for preventing deflection or damage on the fine conductive traces in the outer part of a circuit pattern formed on a flexible circuit board in the step of singulation, resulting in a decrease of possible short-circuits.

A second objective of the present invention is to provide a method of manufacturing a ball grid array semiconductor package, for preventing cracks in the side wall of a resin encapsulant section and also effectively preventing the bending of the finished semiconductor package in the step of singulation.

A third objective of the present invention is to provide a method of manufacturing a ball grid array semiconductor package, for preventing the occurrence of cracks in a resin encapsulant section caused by a concentrated stress in pressing the resin encapsulant section to take off the semiconductor package by means of a singulation tool in the step of singulation.

A fourth objective of the present invention is to provide a method of manufacturing a ball grid array semiconductor package, in which an adhesive double-coated tape disposed between the flexible circuit board and the carrier frame is not subjected by an elongation into the through hole of the carrier frame in the step of molding the resin encapsulant section, so that the resin encapsulant section has its outer part with a good and neat appearance and also the adhesive strength is maintained between the flexible circuit board and the resin encapsulant section, thereby enhancing the reliability of the semiconductor package.

A fifth objective of the present invention is to provide a method of manufacturing a ball grid array semiconductor package, in which flexible circuit board units are formed in the piece with the subsequent step of fixing the carrier frame. The method secures that the circuit patterns be disposed within the respective through holes of the carrier frame and decreases the waste of expensive, flexible circuit board, permitting the cost reduction and thereby enhancing the manufacture efficiency and production yield.

A sixth objective of the present invention is to provide a method of manufacturing a ball grid array semiconductor package, for preventing the adhesive coating from bleeding out in the step of mounting a semiconductor chip and decreasing the failure of wire bonding due to the entrance of adhesive on bond fingers.

A seventh objective of the present invention is to provide a method of manufacturing a ball grid array semiconductor package, in which a tag is formed during or after the step of forming the flexible circuit board strip (or unit) so that the position of the flexible circuit board strip (or unit) can be found in the manufacture of the semiconductor package or after the separation of finished package in the piece, permitting the prevention of defect occurrences during the manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

According to a preferred embodiment of the present invention to achieve the first objective, there is provided a method of manufacturing a ball grid array semiconductor package, comprising the steps of: forming a flexible circuit board strip having plural circuit pattern sections including a plurality of conductive traces having bond fingers and conductive ball lands on a flexible resin film; adhesively fixing a carrier frame onto the flexible circuit board strip by using an adhesive double-coated tape having a plurality of through holes at positions corresponding in a one to one relation with the plural circuit patterns on the flexible circuit board strip, thus exposing the circuit pattern sections; mounting semiconductor chips having a plurality of input/output pads in the center of the respective plural circuit patterns; electrically connecting the input/output pads of the semiconductor chips to the bond fingers of the respective circuit pattern sections; molding a resin encapsulant section for protecting the semiconductor chips and electrical connecting means against external environments; adhesively fusing a plurality of conductive balls provided as input/output terminals on the bottom surface of the flexible circuit board; and conducting a singulation by forming notches in the flexible resin film and the adhesive double-coated tape by use of a punch and by pressing the resin encapsulant section from the upside to remove the carrier frame and separate semiconductor packages in the piece.

According to a preferred embodiment of the present invention to achieve the second objective, the carrier frame perforated with the through holes having a slanted inside wall with the upper part narrower than the lower one is used in the step of fixing the carrier frame, thereby forming multiple slanted faces in the side wall of the resin encapsulant section in the step of molding.

According to a preferred embodiment of the present invention to achieve the third objective, the resin encapsulant section is pressed from the upside thereof by means of a singulation tool having a slanted bottom surface in the step of singulation.

According to a preferred embodiment of the present invention to achieve the fourth objective, the through holes formed in the adhesive double-coated tape are larger in width than those disposed in the carrier frame in the step of fixing the carrier frame.

According to a preferred embodiment of the present invention to achieve the fifth objective, there is provided a method of manufacturing a ball grid array semiconductor package comprising the step of: forming flexible circuit board units including plural conductive traces having bond fingers and conductive ball lands on the flexible resin film, instead of conducting the step of forming the flexible circuit board strip; and by use of an adhesively double-coated tape and a carrier frame having a plurality of through holes at least equal in size to the circuit pattern sections on the flexible circuit board units, adhesively fixing, adhesively fixing the carrier frame to the flexible circuit board units to expose the circuit pattern sections through the through holes of the adhesive double-coated tape and their corresponding through holes of the carrier frame.

According to a preferred embodiment of the present invention to achieve the sixth objective, there is provided a method of manufacturing a ball grid array semiconductor package comprising the step of forming a dam for preventing an overflow of adhesive in the area between a semiconductor chip mounting region and the bond fingers on the flexible circuit board, between the steps of fixing the carrier frame and mounting the semiconductor chips.

According to a preferred embodiment of the present invention to achieve the seventh objective, there is provided a method of manufacturing a ball grid array semiconductor package comprising the step of forming a position-finding tag on the bottom surface of the respective circuit pattern sections on the flexible circuit board during or after the step of forming the flexible circuit board strip.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 1b is a cross-sectional view of the flexible circuit board strip after the step of fixing the carrier frame as illustrated in FIG. 1a;

FIGS. 7b and 7c are side cross-sectional views illustrating the method of manufacturing a ball grid array semiconductor package in accordance with a preferred embodiment of the present invention using the step of fixing the carrier frame as illustrated in FIG. 7a;

FIG. 8b is a cross-sectional view illustrating the flexible circuit board units after the step of fixing the carrier frame as shown in FIG. 8a;

DETAILED DESCRIPTION OF PREFERRED EMBODIMENT

Reference will now be made in detail to the preferred embodiments of the present invention, examples of which are illustrated in the accompanying drawings.

A schematic illustration of a method to attain the first objective of the invention is presented in FIGS. 1a, 1b, and 2a–2g.

Figure 1A:
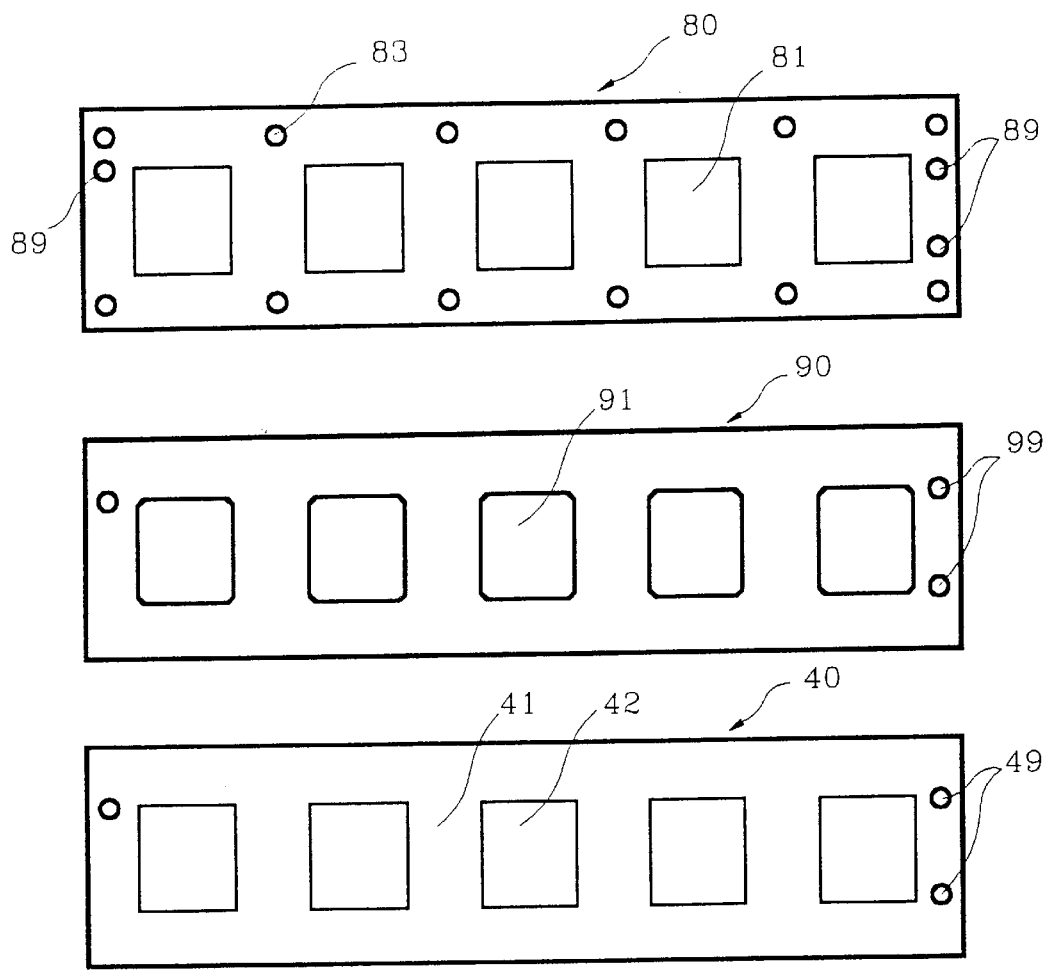
FIG. 1a is a diagram illustrating the step of fixing a carrier frame with respect to a flexible circuit board strip in the method of the present invention.
Figure 1A:
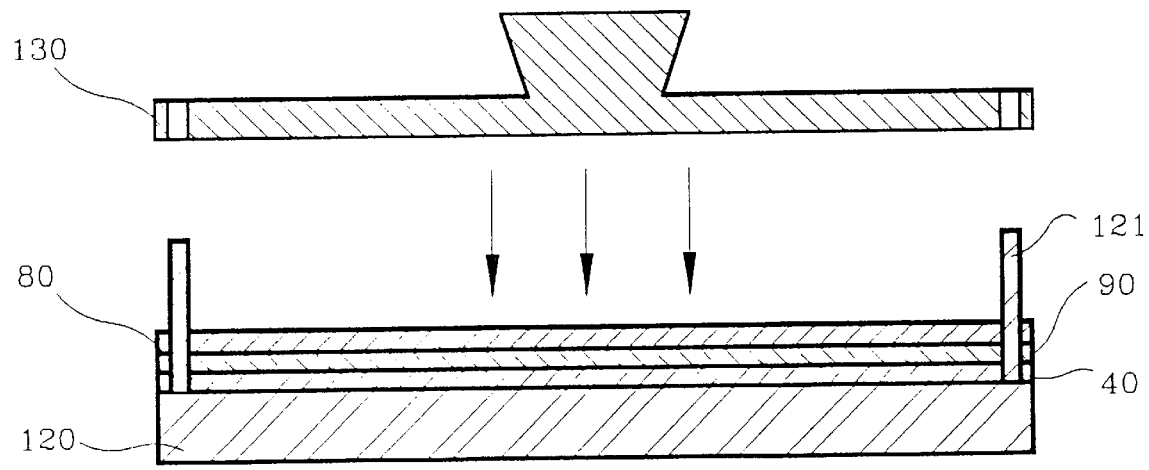

Referring to FIG. 1a, wherein reference numeral 80 indicates a carrier frame, reference numeral 90 indicating an adhesive double-coated tape of a resin adhesive, e.g., epoxy resin, reference numeral 40 indicating a flexible circuit board while numerals 130 and 120 designate a pressure tool and a jig, respectively, there is shown a diagrammatic illustration of the step of fixing carrier frame 80 with respect to flexible circuit board strip 40.

As shown in FIG. 1a, in the step of forming the flexible @ circuit board strip 40, a conductive metal thin film is first laminated on a flexible resin pulp 41, e.g., polyimide, the thickness of which is in the range of between 20 $\mu$ and 150 $\mu$, and preferably between 30 $\mu$ and 80 $\mu$, with a subsequent formation of circuit pattern sections 42 by way of the customary technique such as etching, the flexible circuit board strip 40 being perforated with fixing pin holes 49 on its both end portions.

Circuit pattern sections 42 comprises plural conductive traces (not shown) having bond fingers (not shown) and conductive ball lands (not shown), which will be mentioned later. A die pad (now shown) for mounting a semiconductor chip thereon is not specifically limited and may be provided in the center of each of the circuit pattern sections 42. Flexible circuit board strip 40 has a plurality of circuit pattern sections 42 which are disposed apart from one another.

Flexible circuit board strip 40 may be produced in the strip form, as illustrated in FIG. 1a, or in the form of a rill, or it can be manufactured in the piece.

Adhesive double-coated tape 90 is perforated with plural through holes 91 and pin holes 99, which are formed in the identical shape and size and disposed apart from one another, corresponding in a one to one relation with circuit pattern sections 42 and pin holes 49 of the flexible circuit board strip 40, respectively. Through holes 91 are disposed at positions corresponding to the plural circuit pattern sections 42 on the flexible circuit board strip 40, and they are equal to or a little larger in size than the circuit pattern sections 42.

Carrier frame 80, which typically consists of metals, e.g., copper, copper alloy, stainless steel or the like, is subjected by an anodization to form a thin film for surface protection, or by a surface treatment with nickel (Ni) or chrome (Cr) in order to facilitate the degating from an epoxy molding compound in the step of a molding and also to aid an easy separation of the carrier frame 80 in the step of singulation. In the similar way to the adhesive double-coated tape 90, carrier frame 80 has a plurality of through holes 81 and pin holes 89, which are formed in the identical shape and size and disposed apart from one another, corresponding in a one to one relation with circuit pattern sections 42 and pin holes 49, respectively. In addition to pin holes 89, the carrier frame 80 is further perforated with guide holes 83 for the purpose of easy carriage and determination of its location.

Pressure tool 130 has solely pin holes, while the jig 120 is provided with pins 121.

Referring to the lower section of FIG. 1a illustrating the step of fixing the carrier frame 80, optional lower flat panel (not shown), flexible circuit board strip 40, adhesive double-coated tape 90, and carrier frame 80 are sequentially mounted on the jig 120 with pins 121 inserted into pin holes 49, 99 and 89. They are then pressed with the pressure tool 130, thereby disposing the carrier frame 80 to adhere to the portion other than the circuit pattern sections 42 of the flexible circuit board strip 40. It may be possible to consider other various methods of fixing the carrier frame 80 than as specified in the present invention only for an exemplary example herein. The flexible circuit board strip 40, due to its adhesion to the carrier frame 80, can be fastened in rigid position, which leads to the improvement of efficiency in the manufacture of the semiconductor package.

Figure 1B:
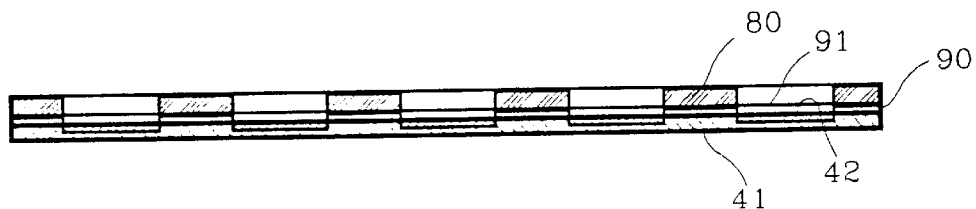

FIG. 1b is a cross-sectional view showing the fixed state of flexible circuit board strip 40 after the step of fixing the carrier frame 80 as illustrated in FIG. 1a. Adhesive double-coated tape 90 is so disposed on the lower surface of the carrier frame 80 as to fix the flexible circuit board strip 40. At this stage, the respective circuit pattern sections 42 formed in the flexible circuit board strip 40 are exposed through the through holes 91 and 81 of adhesive double-coated tape 90 and carrier frame 80.

FIGS. 2a–2g are sequential cross-sections illustrating the method of manufacturing a ball grid array semiconductor package in accordance with a preferred embodiment of the present invention.

Figure 2A:
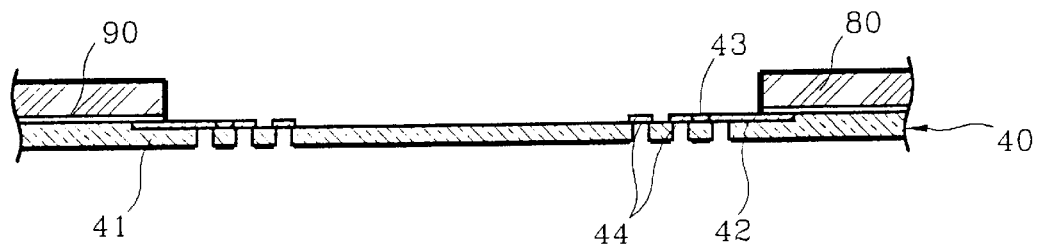
FIGS. 2a–2g are sequential cross-sections illustrating the method of manufacturing a ball grid array semiconductor package in accordance with a preferred embodiment of the present invention.

Referring to FIG. 2a, which is a partial cross-sectional view showing the state after the step of fixing the carrier frame 80, adhesive double-coated tape 90 is disposed to permit the carrier frame 80 to be fixed on the upper surface of the flexible circuit board strip 40 that has circuit pattern sections 42 formed on flexible resin film 41, the circuit pattern sections being exposed through the through holes (reference numerals 81 and 91 in FIG. 1a) of carrier frame 80 and adhesive double-coated tape 90. A die pad (now shown) is not specifically limited and may be so provided in the exposed center of each circuit pattern section 42 as to mount a semiconductor chip.

Circuit pattern section 42 has bond fingers 43 for providing an electrical connection to the semiconductor chip via wire bonding. Flexible resin film 41 disposed on the lower surface of the circuit pattern section 42 is perforated at designated positions by mechanical means, i.e., punching, or by chemical means, i.e., etching, thus forming conductive ball lands 44 with the lower surface of circuit pattern section 42 exposed. It is preferable to coat bond fingers 43 with silver for the purpose of enhancing the adhesion during wire bonding, with conductive ball lands 44 coated with a gold or nickel coating (now shown) for enhancing the adhesion to the conductive balls.

Figure 2B:
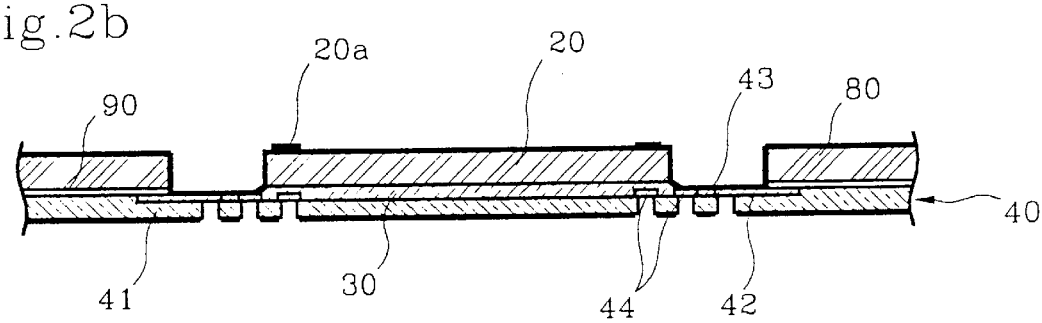

FIG. 2b is a partial cross-sectional view illustrating the step of mounting the semiconductor chip, which is coated with an adhesive coating 30 on its lower surface and thereby mounted in the exposed center of circuit pattern section 42 of the flexible circuit board strip 40 through the through holes (reference numerals 81 and 91 in FIG. 1a) of carrier frame 80 and adhesive double-coated tape 90. Adhesive coating 30 is formed from a cured resin adhesive, e.g., epoxy, and preferably from a silver-containing epoxy resin that has high thermal conductivity.

Figure 2C:
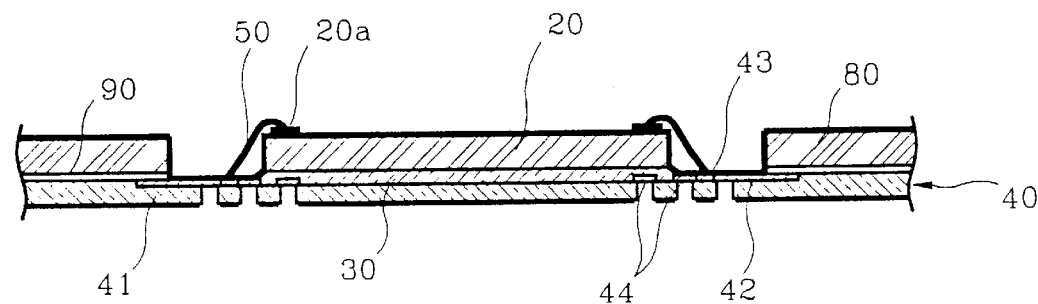

FIG. 2c is a partial cross-sectional view illustrating the step of electrical connection, wherein I/O pads 20a on the mounted semiconductor chip 20 are electrically connected to bond fingers 43 of the circuit pattern section 42 by way of bonding of conductive wires 50 or bumps (not shown). Conductive wires 50 are not specially limited and use thin wires consisting of gold or aluminum, and the bumps are typically solders.

Figure 2D:
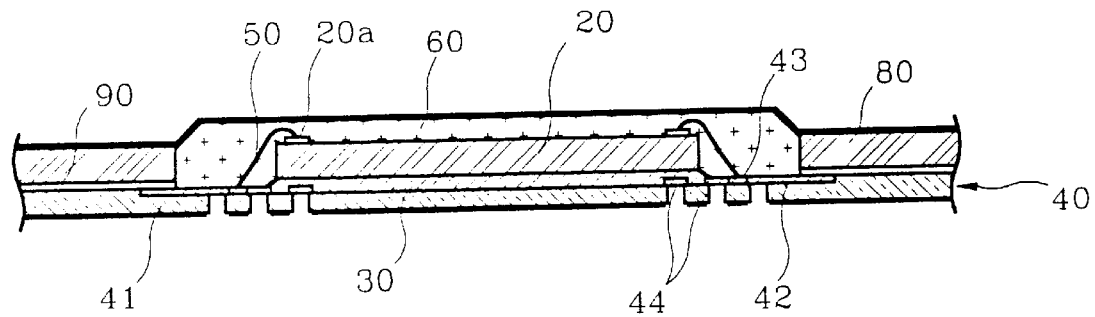

FIG. 2d is a partial cross-sectional view illustrating the step of molding a resin encapsulant section 60, which is formed from an encapsulant material well-known in the art, e.g., epoxy molding compound or liquid epoxy, for protecting semiconductor chip 20, electrical connecting means, such as conductive wires 50, and circuit pattern section 42 against harmful environments including water vapor, dusts, external shocks or vibrations. Resin encapsulant section 60 is disposed on the upper surface of the circuit pattern section 42 in such an area as is defined by the inside wall of the through hole of the carrier frame 80. Therefore, the resin encapsulant section 60 has the side wall in contact with the inside wall of the through hole of carrier frame 80. Resin encapsulant section 60 is used to decrease the stress and deflection force caused by a difference between the heat expansion coefficients of semiconductor chip 20 and flexible circuit board 40 during an operation of semiconductor chip 2 of the finished semiconductor package and also to disperse the stress and deflection force concentrated on the corners of the semiconductor chip 20.

Figure 2E:
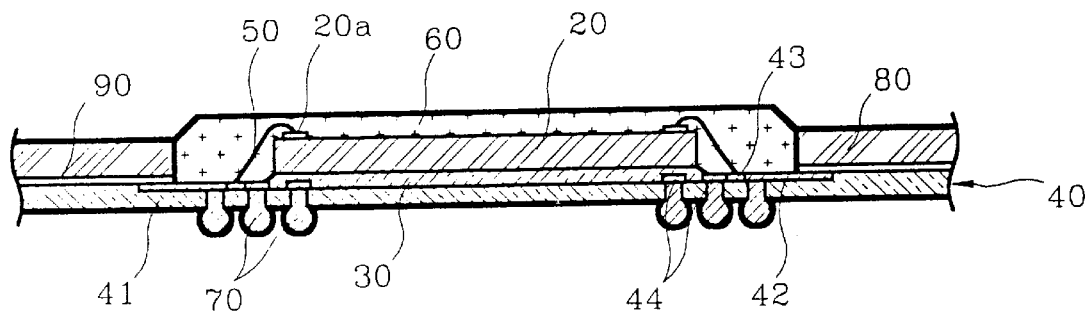

FIG. 2e is a partial cross-sectional view illustrating the step of melting conductive balls, wherein conductive balls 70, e.g., solders are adhesively fused to conductive ball lands 44 which are electrically connected to the circuit pattern 42.

Figure 2F:
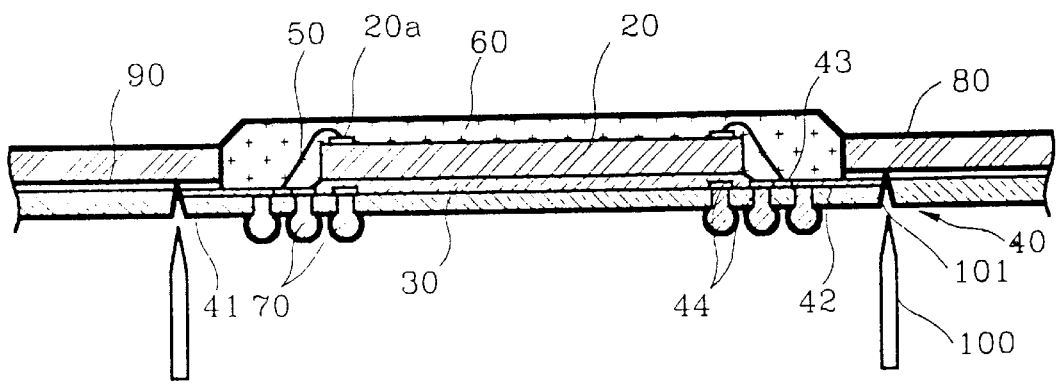
Figure 2G:
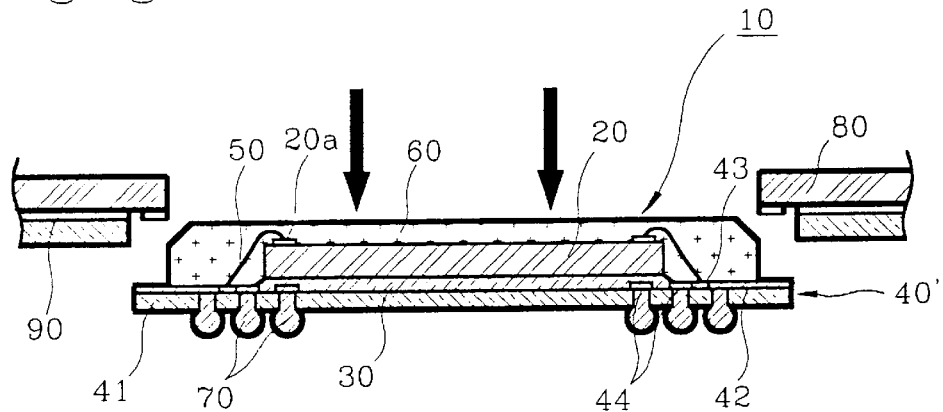

FIGS. 2f and 2g are partial cross-sectional views illustrating the step of singulation. As shown in FIGS. 2f and 2g, notches 101 are formed in both flexible circuit board strip 40 and adhesive double-coated tape 90 in the vicinity of the side ends of the resin encapsulant section 60 by means of a punch 100. Upon pressing down the resin encapsulant section 60, carrier frame 80 is taken off, concurrently separating ball grid array semiconductor packages 10 in the piece. At this stage, part of adhesive double-coated tape 90 in the outside of the resin encapsulant section 60 can also be removed.

It is preferable to dispose notches 101 also in the lower surface of the carrier frame 80 in such a depth as to easily take off the carrier frame 80 by a press for the purpose of easy singulation. The separated carrier frame 80 may be reused.

Singulation can also be achieved with enhanced efficiency by upwardly pressing the outside of the notches 101 as well as pressing down the resin encapsulant section 60 in the removal of carrier frame 80.

Notches 101, providing an indentation along the final profile of the semiconductor package 10, are not specially limited and may be formed in the straight lines on the four edges of a perfect square, or provided in the form of straight lines to take off four corners of a perfect square, or the combination thereof.

Figure 3A:
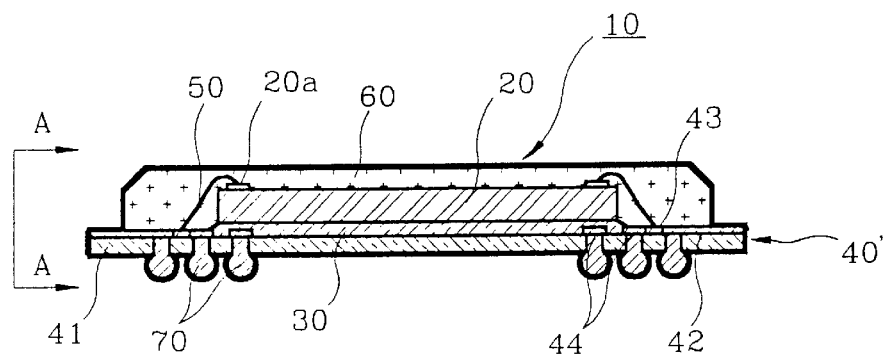
FIG. 3a is a cross-sectional view of the ball grid array semiconductor package manufactured by the method as illustrated in FIGS. 2a–2g.
Figure 3B:
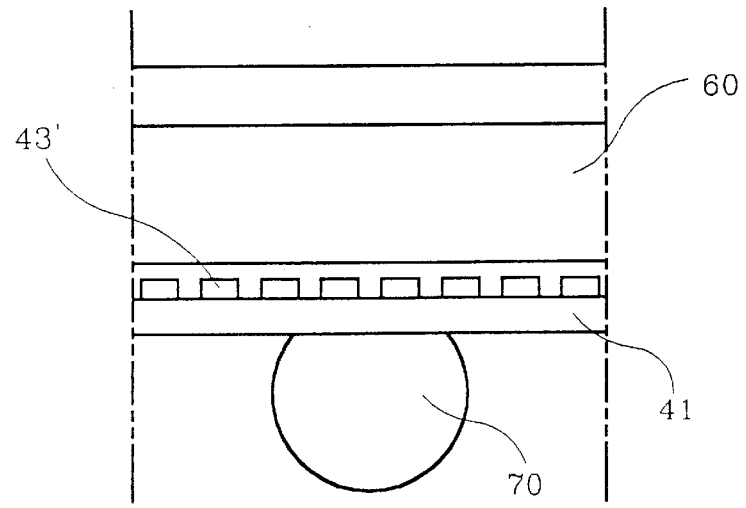
FIG. 3b is a side view taken on the line A—A in FIG. 3.

FIG. 3 is a side cross-sectional view of a ball grid array semiconductor package 10 manufactured by a method according to the preferred embodiment of the present invention as previously described above.

FIG. 3a is a side view taken on line A—A of FIG. 3, wherein conductive traces 43' extending from circuit pattern section 42 are arranged on the flexible resin film 41. As a result of removing carrier frame 80 and cutting flexible circuit board strip 40, the conductive trances 43' outwardly exposed between the cut-off line formed by notches 101 and the resin encapsulant section 60 preferably have such a minimum length as to allow a performance test of the separated semiconductor package 10 in the piece.

As described above, the method of manufacturing the ball grid array semiconductor package in accordance to the first preferred embodiment to attain the first objective of the present invention enables us to prevent deflection or damage on the fine conductive traces in the outer part of the circuit pattern formed on the flexible circuit board, thus resulting in decreasing a possible short-circuit.

Figure 4A:
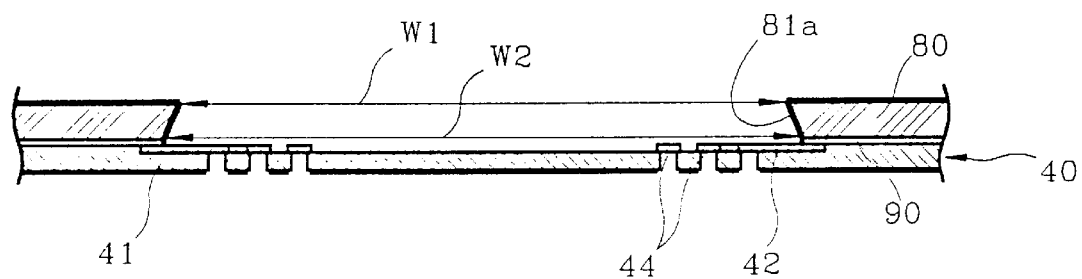
FIGS. 4a–4c are sequential cross-sections illustrating the method of manufacturing a ball grid array semiconductor package in accordance with another preferred embodiment of the present invention using a carrier frame having the through holes with a slanted inside wall having the upper part narrower than the lower one.
Figure 4B:
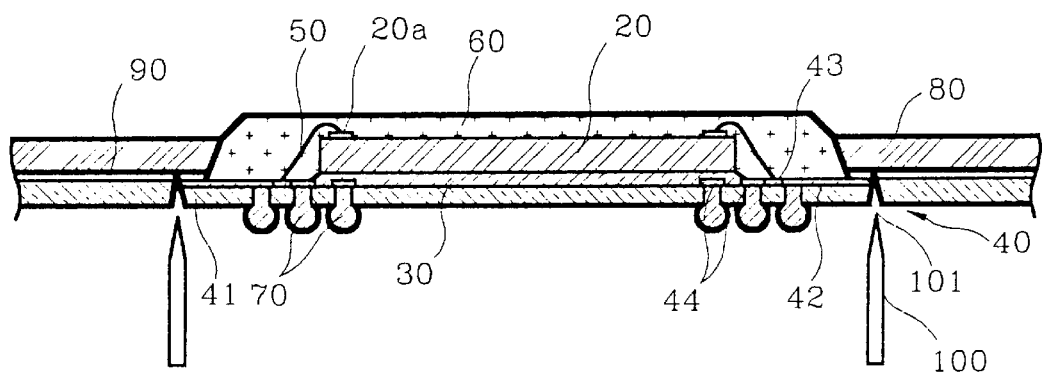
Figure 4C:
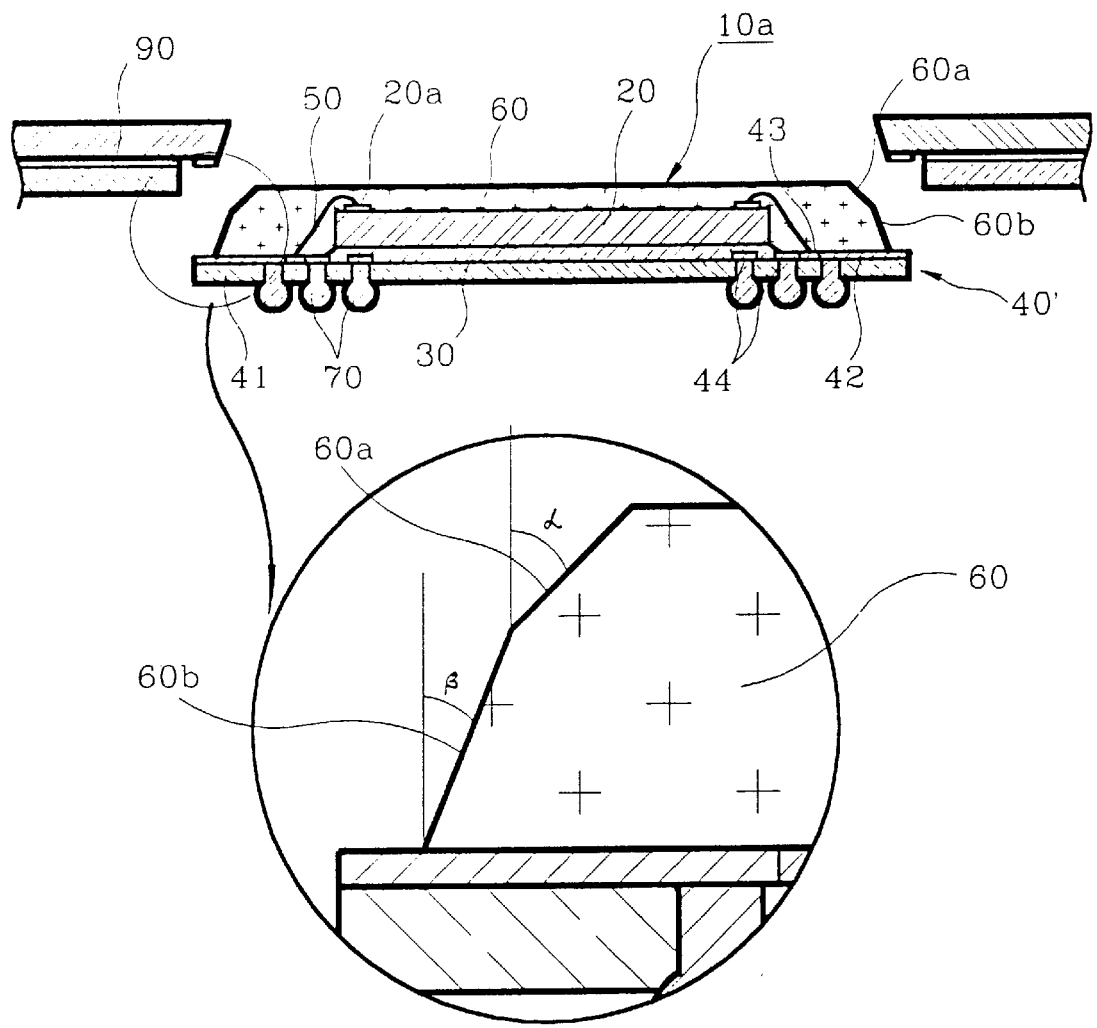

A schematic illustration of a method to attain the second objective of the invention is presented in FIGS. 4a–4c.

FIGS. 4a–4c are sequential cross-sections illustrating the method of manufacturing a ball grid array semiconductor package in accordance with another preferred embodiment of the present invention, wherein carrier frame 80 has through holes (reference numeral 81 in FIG. 1a) whose inside wall 81a is slanted with the upper part getting narrower.

FIG. 4a is a partial cross-sectional view showing the semiconductor package after the step of fixing the carrier frame 80. The structure is substantially analogous to that as shown in FIG. 2a with the exception that through hole 81 of carrier frame 80 has a slanted inside wall 81a in which the upper width W1 is smaller than the lower width W2.

FIGS. 4b and 4c are partial cross-sectional views illustrating the step of singulation, and completely similar to FIGS. 2f and 2g in that notches 101 are formed in both flexible circuit board strip 40 and adhesive double-coated tape 90 in the vicinity of the side ends of resin encapsulant section 60 by means of a punch 100. Upon pressing down the resin encapsulant section 60, carrier frame 80 is taken off, thereby separating ball grid array semiconductor packages 10 in the piece.

It should be noted that through hole 81 of carrier frame 80 is provided with slanted inside wall 81a having the upper part narrower than the lower part so that the lower side wall of resin encapsulant section 60 has a second face 60b which is not perpendicular as shown in FIG. 2f but is slanted at a vertical angle of β. Consequently, the side wall of resin encapsulant section 60 has such a profile as includes a first face 60a slanted at a vertical angle of α in the upper part defined by the cavity profile of the upper mold (not shown), and a second face 60b slanted at a vertical angle of β in the lower part defined by the slanted inside wall 81a having the upper part narrower than the lower part.

Through hole 81 of the carrier frame 80 is typically formed by an etching technique that the inside wall 81a of through hole 81 has minute and numerous projections and recesses, which might cause production of cracks in the side wall of resin encapsulant section 60 in the course of removal of carrier frame 80 in the step of singulation. According to the preferred embodiment of the present invention, however, the inside wall of through hole 81 of carrier frame 80 has the slanted inside wall 81a with the upper part narrower than the lower part sufficient that the carrier frame 80 could be taken off from the upper part of resin encapsulant section 60 in the step of singulation without causing cracks in the resin encapsulant section 60. Therefore, the through hole 81 of carrier frame 80 according to the prevent embodiment is formed either by mechanical means, i.e., stamping, or by chemical means, i.e., etching, where the former means is preferred in order to obtain the smooth surface with ease.

Figure 5:
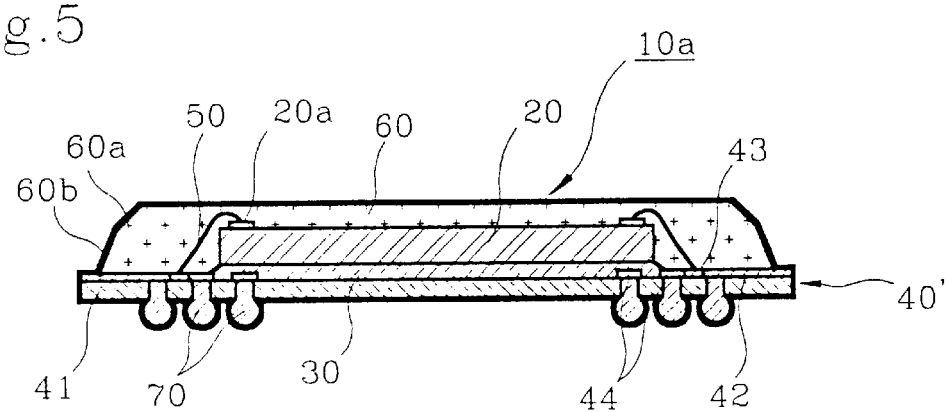
FIG. 5 is a cross-sectional view of the ball grid array semiconductor package manufactured by the method as illustrated in FIGS. 4a–4c.

FIG. 5 is a side cross-sectional view of the ball grid array semiconductor package 10a manufactured by the method as illustrated in FIGS. 4a–4c. The structure is substantially analogous to that of semiconductor package 10 as shown in FIG. 3 with the exception that resin encapsulant section 60 has double faces 60a and 60b, the upper face being smaller in area than the lower face.

These multi faces 60a and 60b formed in the lateral surface of the resin encapsulant section 60 have an effect in preventing the package 10a from being bent through a heat generated in the step of melting conductive balls or during the operation of finished package 10a built on a main board (not shown), and thus effectively reducing an exfoliation between the resin encapsulant section 60 and flexible circuit board 40 caused by the bent package 10a.

As described above, in the method of manufacturing a ball grid array semiconductor package in accordance with the preferred embodiment of the present invention to attain the second objective of the invention, the carrier frame can be easily separated from the side wall of the resin encapsulant section without causing cracks of the side wall, and additionally the cracks or exfoliation in the resin encapsulant section due to heat can be dramatically reduced during the manufacturing or operating process of the semiconductor package at high temperature.

Figure 6:
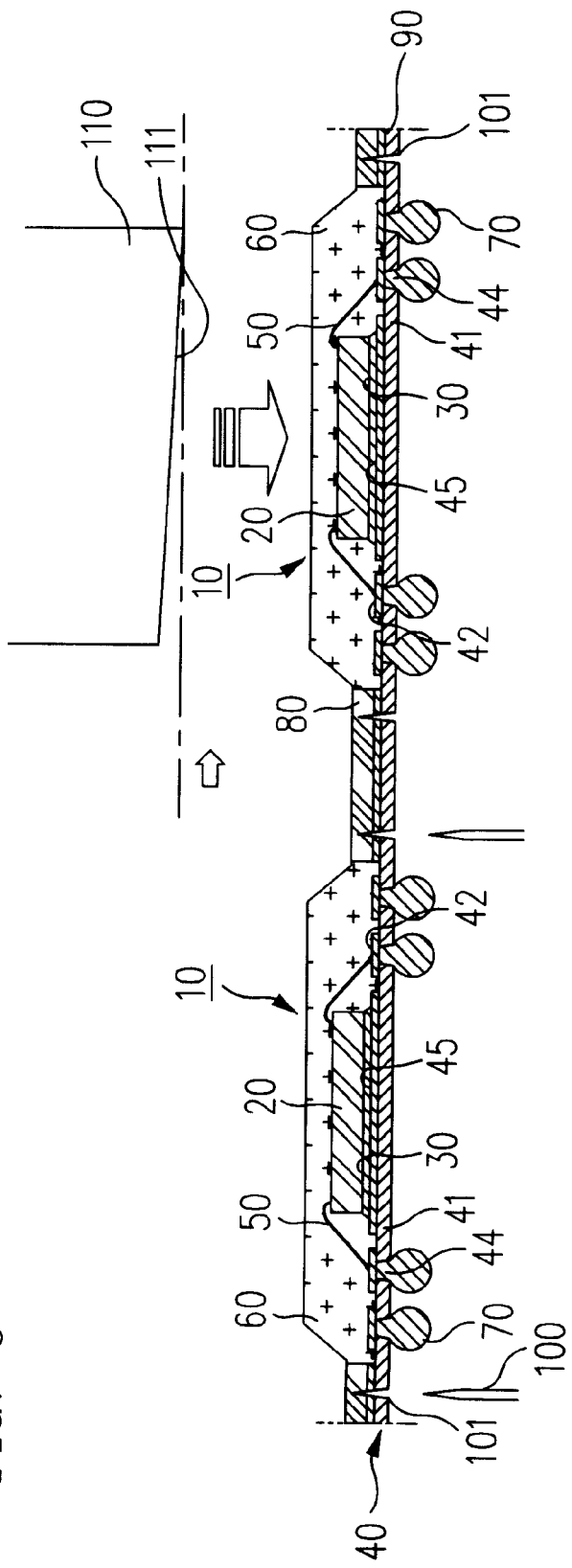
FIG. 6 is a side cross-sectional view illustrating the step of singulation in the method of the present invention.

A schematic illustration of a method to attain the third objective of the invention is presented in FIG. 6, which is a side cross-sectional view illustrating the step of singulation.

The step of singulation is substantially analogous to that as shown in FIGS. 2f and 2g.

The singulation is conducted in a successive manner, for example, from the left to the right as indicated by arrows in FIG. 6. Out of two package units 10, the left one is shown to illustrate the formation of notches 101 by using a punch 100 and the right one provides an illustration of the pressing step by means of singulation tool 110.

Pressing down the resin encapsulant section 60 in the step of singulation to separate semiconductor packages 10 in the piece is usually conducted by the singulation tool 110 having flat bottom surface to strike, in which case the bottom surface of the singulation tool 110 gets in contact with all part of the top surface of the resin encapsulant section 60 to transfer all striking shocks at a stroke and by this way cause cracks in the resin encapsulant section 60. According to the preferred embodiment, however, the singulation tool 110 has a slanted bottom surface 111 to gradually transfer the pressing force upon the resin encapsulant section 60 in the step of singulation.

Therefore, the one side of each semiconductor package 10 is simultaneously separated at a strike by use of the slanted bottom surface 111 of the singulation tool 110 and the other side is subsequently taken off.

As described above, in the method of manufacturing a ball grid array semiconductor package in accordance with the preferred embodiment of the present invention to achieve the third objective of the invention, such a singulation tool is used as to conduct the singulation without generating cracks in the resin encapsulant section by a strike.

Figure 7A:
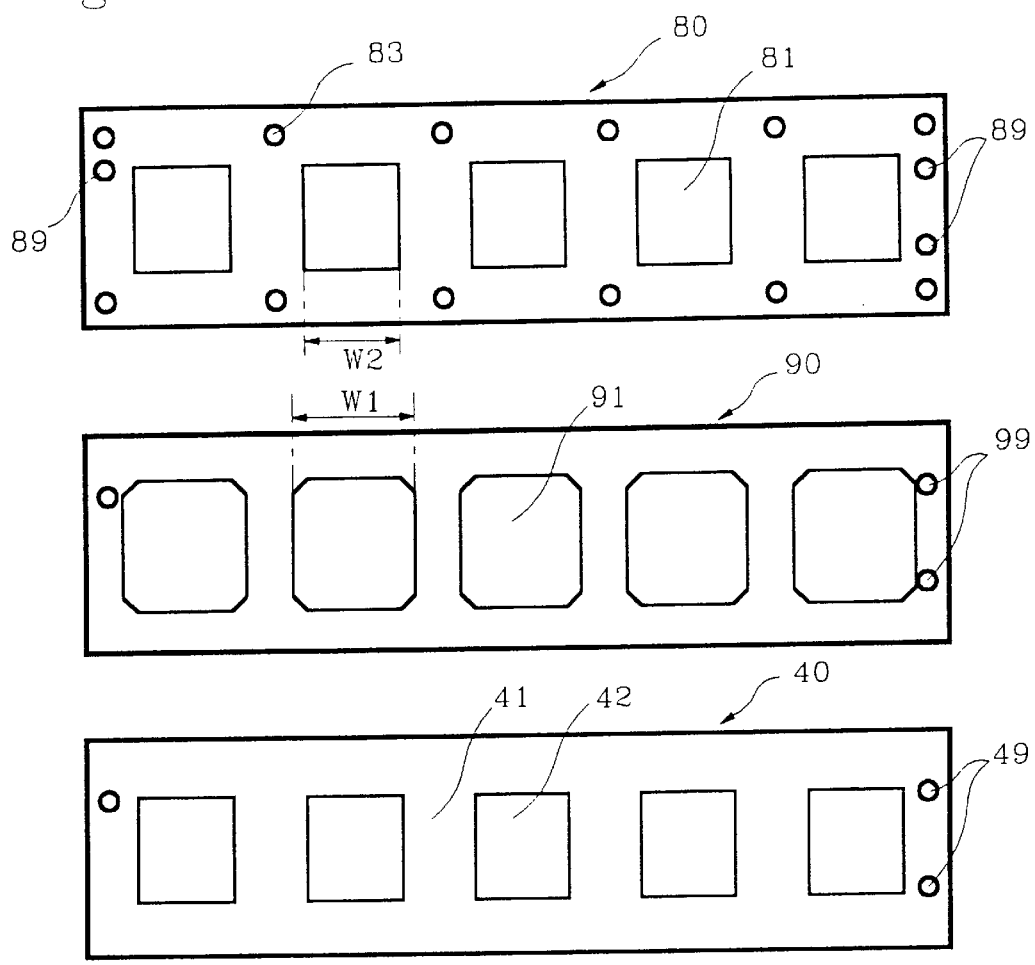
FIG. 7a is a diagram illustrating the step of fixing a carrier frame with respect to a flexible circuit board strip in accordance with a preferred embodiment of the present invention.
Figure 7A:
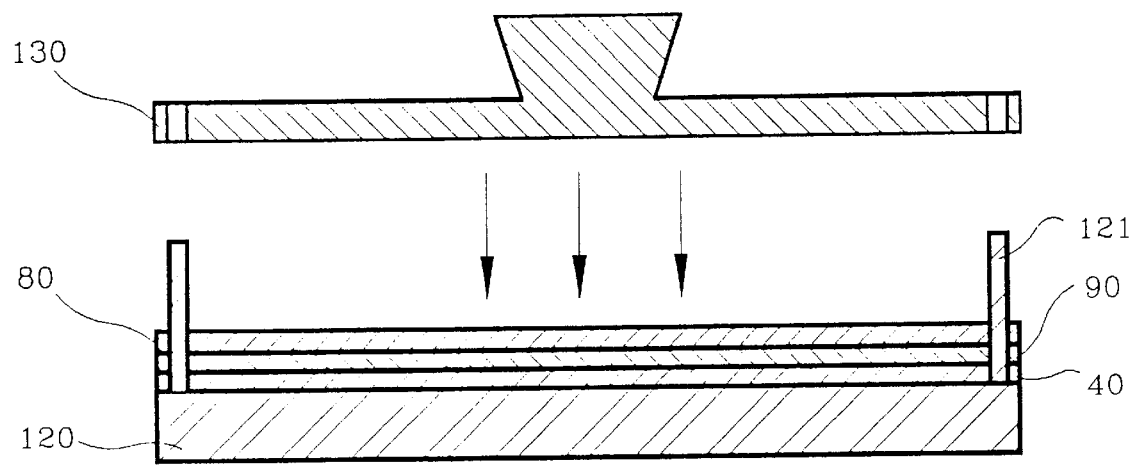
Figure 7B:
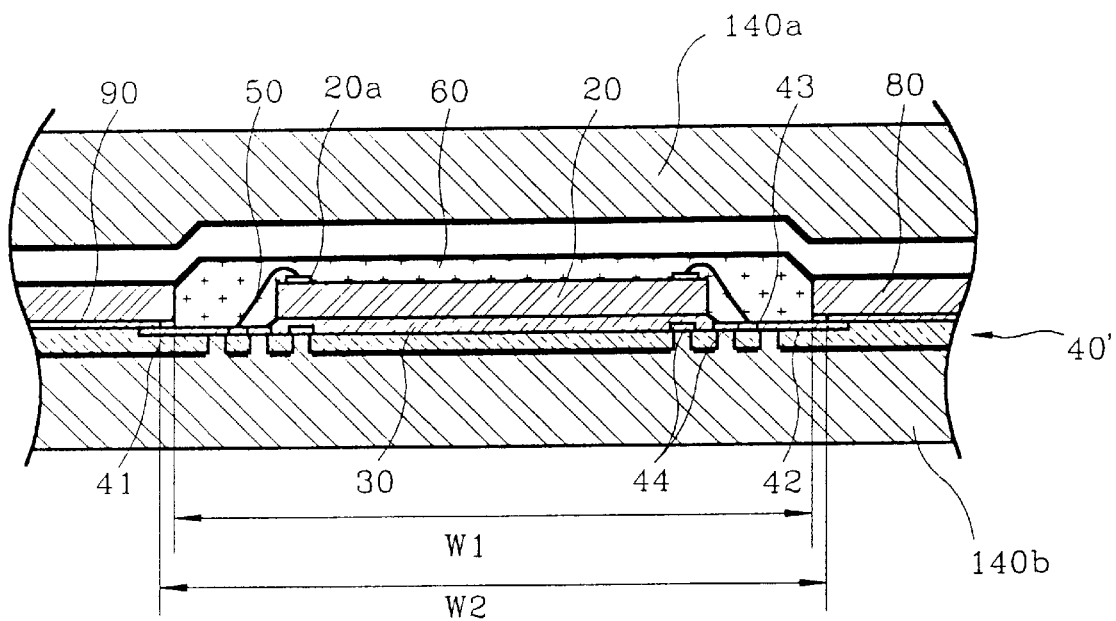
Figure 7C:
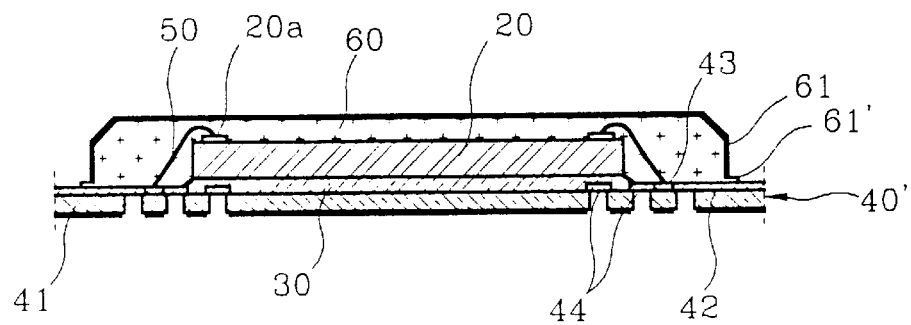

A schematic illustration of a method to attain the fourth objective of the invention is presented in FIGS. 7a–7c.

Referring to FIG. 7a, there is shown a diagrammatic illustration of the step of fixing carrier frame 80 with respect to flexible circuit board strip 40 in accordance with another preferred embodiment of the present invention. The embodiment is substantially similar to that as shown in FIG. 1a with the exception that the width W1 of through holes 81 formed in carrier frame 80 is a little larger than the width W2 of through holes 91 in adhesive double-coated tape 90.

FIGS. 7b and 7c are side cross-sectional views illustrating the states during and after the step of molding in the method of manufacturing a ball grid array semiconductor package by use of step of mounting the carrier frame according to a preferred embodiment of the present invention.

The width W1 of through hole 91 is slightly larger than the width W2 of through hole 81 so that through hole 91 formed in adhesive double-coated tape 90 is larger in size than through hole 81 in carrier frame 80. The width W1 of through hole 91 is preferably larger than the width W2 of through hole 81 by about 25 to 700 μm. If the width difference is less than 25 μm, adhesive double-coated tape 90 gets elongated into a cavity, that is, a molding region formed by combined upper and lower molds 140a and 140b, forcing the ends of adhesive double-coated tape 90 to form protrusions. The portion in the molding region occupied by the protruded ends allows the formation of a recess (not shown) in the outer part of the lower end of resin encapsulant section 50, thereby resulting in deterioration of visual 20 appearance and adversely affecting the adhesive strength due to the decreased area of resin encapsulant section 60. When the width difference is above 700 μm, the elongation of adhesive double-coated tape 90 resulting from the coupling force between upper and lower molds 140a and 140b is insufficient that an excessive of fused encapsulant resin would enter between carrier frame 80 and circuit pattern section 42 in the step of molding, leaving a relatively long bleeding trance after a curing. Such a long bleeding of cured resin may adversely cause surface exfoliation in the main body of resin encapsulant section 60.

As a result, it is preferable to have the width W1 of through hole 91 larger than the width W2 of through hole 81 by 25 to 700 μm sufficient to compensate for the elongation of adhesive double-coated tape 90 caused by the coupling force between upper He and lower molds 140a and 140b so that the ends of adhesive double-coated tape 90 can be fixed in position almost in accordance with those of carrier frame 80. By this way, there is formed only so small a flange 61' at the lower end of vertical side wall 61 of the molded resin encapsulant section 60, permitting the side surface of resin encapsulant section 60 to have a good and clear visual appearance and also preventing production of recesses that adversely affect the adhesive strength in the lower end of the side surface.

As described above, in the method of manufacturing a ball grid array semiconductor package in accordance with the preferred embodiment of the present invention to achieve the fourth objective of the invention, adhesive double-coated tape 90 is not subjected by an elongation into the through hole of the carrier frame in the step of molding the resin encapsulant section, so that the resin encapsulant section has its outer part with a good and neat appearance and also the adhesive strength is maintained between the flexible circuit board and the resin encapsulant section, thereby enhancing the reliability of the semiconductor package.

Figure 8A:
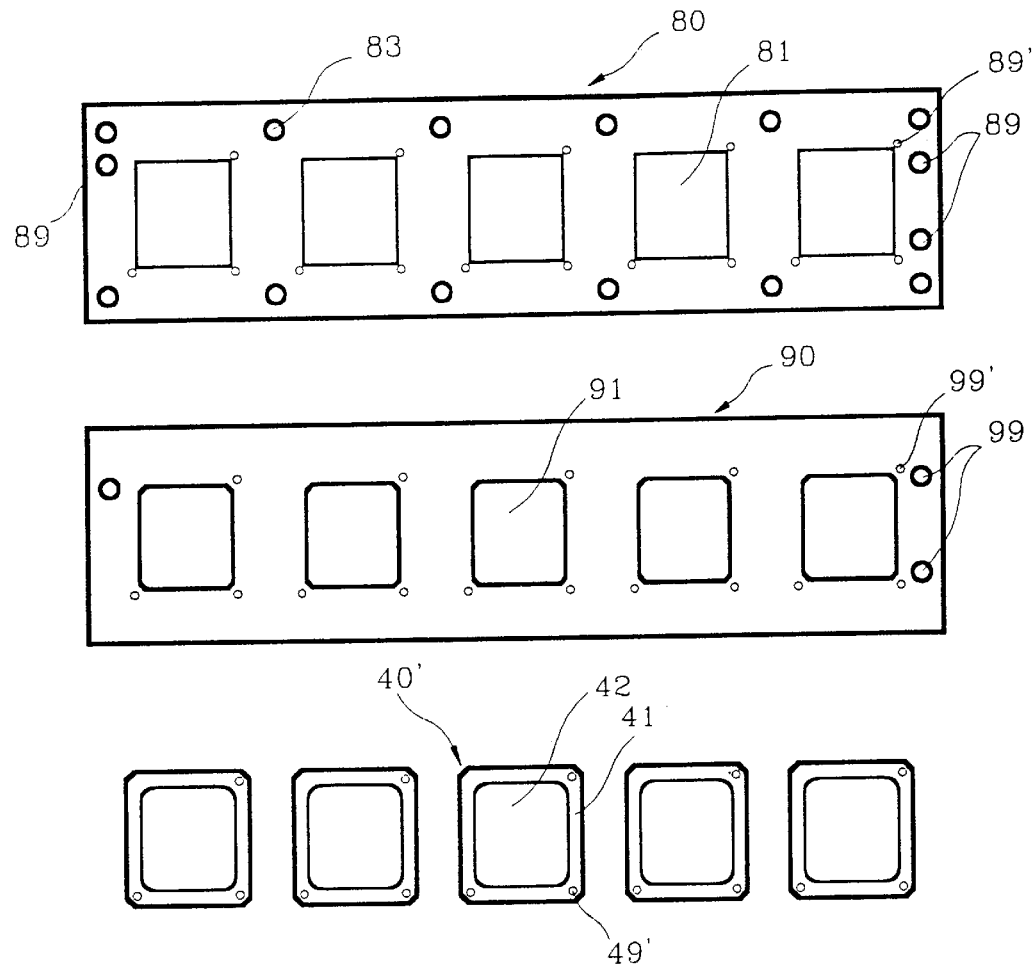
FIG. 8a is a diagram illustrating the step of fixing a carrier frame with respect to a plurality of flexible circuit board units in accordance with another preferred embodiment of the present invention.
Figure 8A:
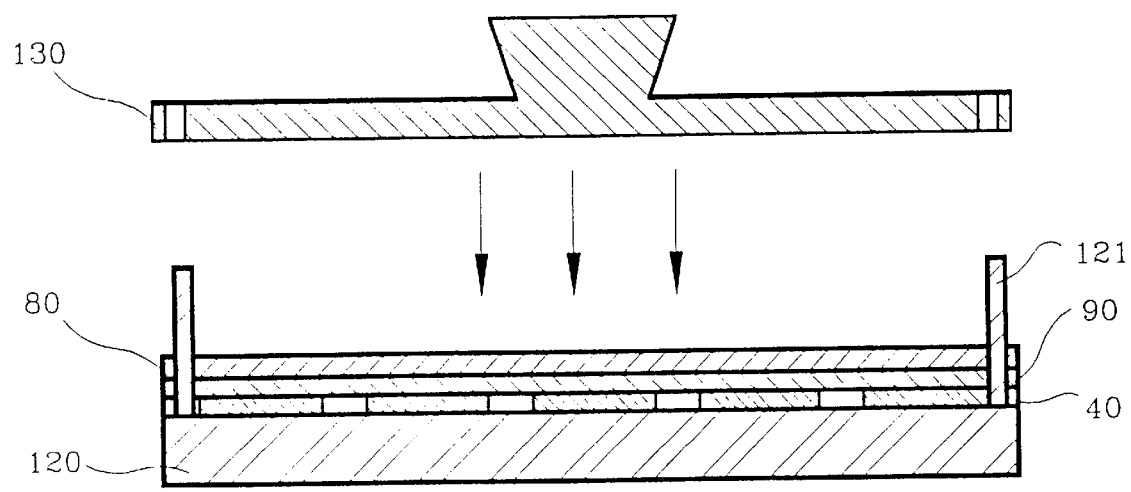
Figure 8B:
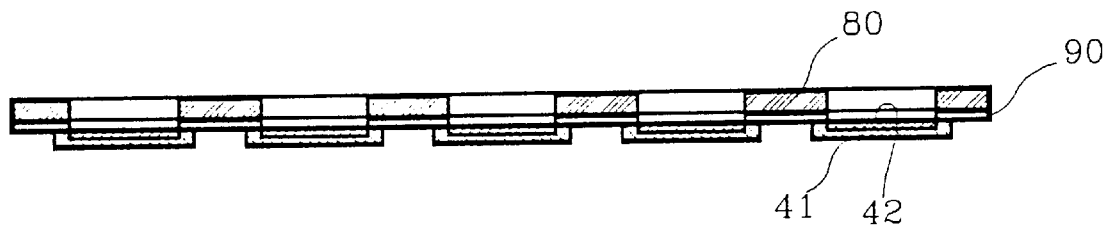

A schematic illustration of a method to attain the fifth objective of the invention is presented in FIGS. 8a and 8b.

Referring to FIG. 8a, there are formed a set of small pin holes 49' at three corners of each circuit pattern section 42 on the flexible circuit board unit 40', and carrier frame 80 and adhesive double-coated tape 90 have sets of three pin holes 89' and 99', respectively, at positions corresponding in a one to one relation with the pin holes 49' of the circuit pattern section 42. These small pin holes 49', 89' and 99' enable us to have the flexible circuit board unit 40' disposed at a desired position in the step of fixing the carrier frame 80. Three small pin holes 49' are provided at three corners of the circuit pattern section 42 on the flexible circuit board unit 40' so as to prevent any problem with respect to dislocation of the flexible circuit board unit 40', and the positions or the number of pin holes 49' are optional insofar as such a problem could be prevented.

In the step of fixing carrier frame 80 according to the present embodiment, the circuit pattern section 42 formed in the flexible circuit board unit 40' is positioned to be exposed through the through holes 91 and 81 of adhesive double-coated tape 90 and carrier frame 80. Flexible resin film 41 extending to the outside of the edge of circuit pattern section 42 adheres to the lower surface of the outer part in the vicinity of the through hole 91 of adhesive double-coated tape 90.

FIG. 8b is a cross-sectional view illustrating the fixed state of flexible circuit board units 40' after the step of fixing carrier frame 80, wherein a plurality of flexible circuit board units 40' are independently attached under the respective through holes 81 of carrier frame 80 with adhesive double-coated tape 90 disposed between the units 40' and carrier frame 80.

As the flexible circuit board units 40' are separately fixed in the vicinity of the respective through holes 81 of carrier frame 80, each flexible circuit board unit 40' has a rigidly limited portion pressed by the pressure tool 130 in the step of fixing the carrier frame 80 so that it can be fastened in position without errors due to the elongation of flexible resin film 41.

As described above, in the method of manufacturing a ball grid array semiconductor package in accordance with the preferred embodiment of the present invention to achieve the fifth objective of the invention, flexible circuit board units are formed in the piece with the subsequent step of fixing the carrier frame. The method secures that the circuit patterns be disposed within the respective through holes of the carrier frame and decreases the waste of expensive, flexible circuit board, permitting the cost reduction and thereby enhancing the manufacture efficiency and production yield.

Figure 9A:
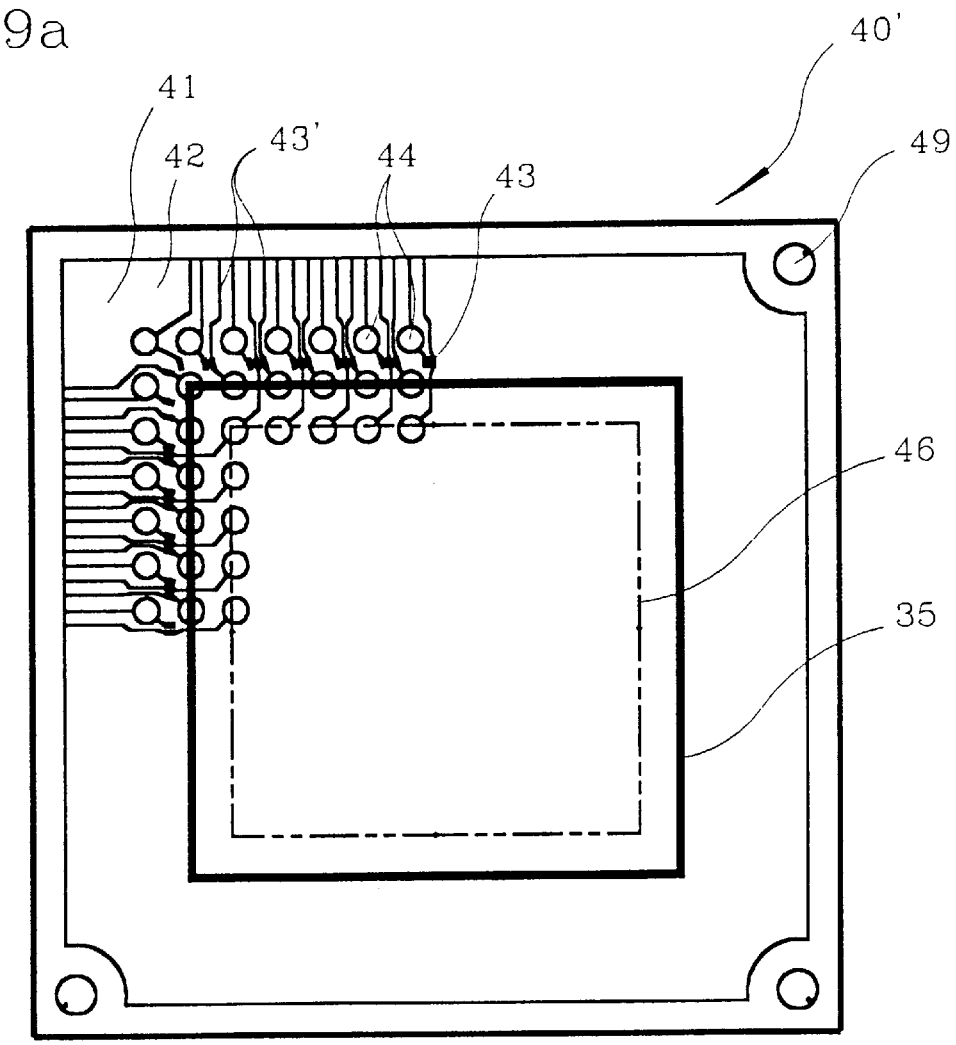
FIG. 9a is a plan view of a flexible circuit board unit provided with a dam for preventing the overflow of an adhesive for mounting a semiconductor chip.
Figure 9B:
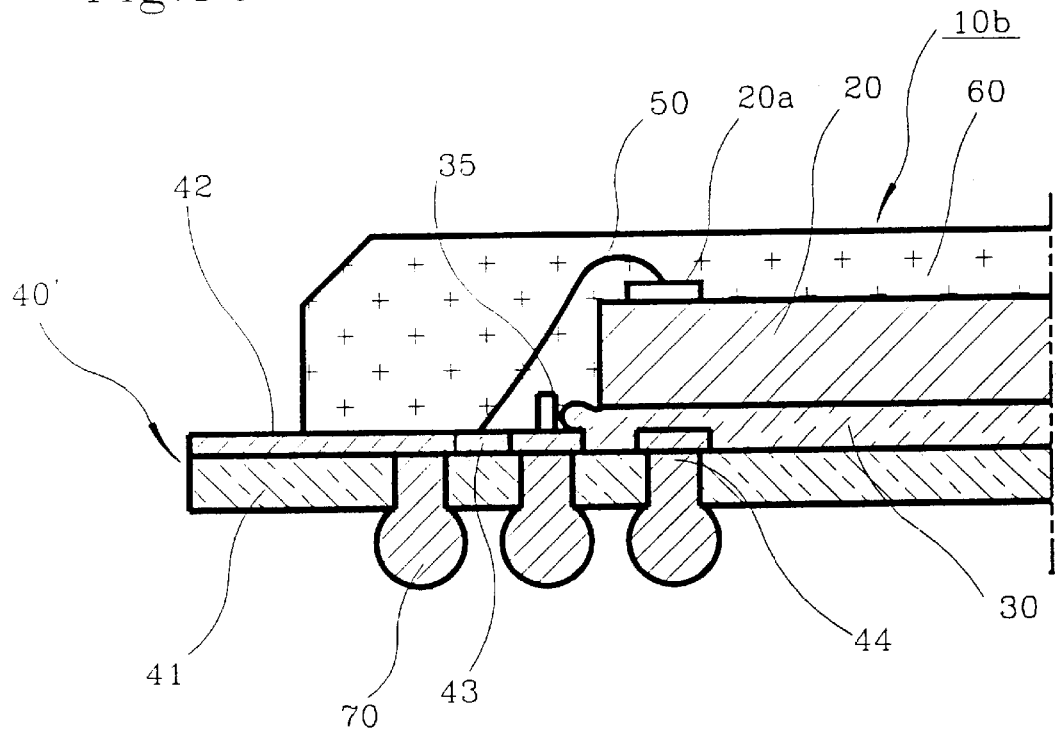
FIG. 9b is a cross-sectional view of the ball grid array semiconductor package manufactured by a method in accordance with a preferred embodiment of the present invention using the adhesive-overflow preventing dam.

A schematic illustration of a method to attain the sixth objective of the invention is presented in FIGS. 9a and 9b.

FIG. 9a is a plan view of flexible circuit board unit 40' provided with a dam 35 for preventing the overflow of an adhesive upon mounting a semiconductor chip 20. FIG. 9b is a cross-sectional view of ball grid array semiconductor package 10b manufactured by a method using the adhesive-overflow preventing dam 35 in accordance with another preferred embodiment of the present invention.

The present embodiment is characterized by a formation of the adhesive-overflow preventing dam 35 between the steps of attaching a carrier frame and mounting a semiconductor chip, the dam 35 being disposed between semiconductor chip mounting region 46 and bond fingers 43 formed at the ends of conductive traces 43' on flexible circuit board unit 40'. Circuit pattern section 42 comprises a plurality of conductive traces 43' having conductive ball lands 44 and bond fingers 43, the lower part of each ball land 44 being exposed through the minute through holes (without reference numeral designated) on flexible resin film 41.

Such an adhesive-overflow preventing dam 35, consisting of a non-conductive material prepared from a resin adhesive such as epoxy, with an addition of inorganic silica or the like, is formed in the 20 to 100 μm range of height and prevents electrical connections among the conductive ball lands 44 or conductive trances 43' which constitute circuit pattern section 42 on the flexible resin film 41. It is preferably disposed at such a position apart from all bond fingers 43 at a defined distance towards the inner part of the flexible circuit board unit 40' and sized at least larger than the outer part of the edge of semiconductor chip 20 fixed by adhesive coating 30, so that semiconductor chip 20 can be fixed within the region for forming adhesive-overflow preventing dam 35. The adhesive-overflow preventing dam 35 of above 100 μm in height may cause a connection of conductive wires 50 in the subsequent step of electrical connection to produce defects. If less than 20 μm in height, the dam 35 has no effect in preventing the overflow of the adhesive coating 30 and thus causes a bleeding of melt adhesive. Such a bleeding in the part of bond fingers 43 of circuit pattern section 42 will adversely deteriorate the shear force of the conductive wires 50 which are bonded or not in the subsequent step of electrical connection.

Figure 10:
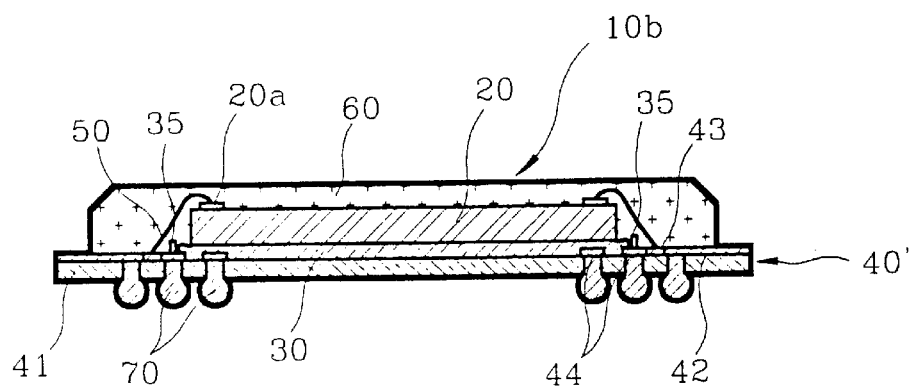
FIG. 10 is a cross-sectional view of the ball grid array semiconductor package manufactured by the method as illustrated in FIGS. 9a and 9b.

FIG. 10 is a side cross-sectional view of ball grid array semiconductor package 10b manufactured by the method as illustrated in FIGS. 9a and 9b. Referring to FIG. 10, the structure is substantially analogous to that of semiconductor package 10 as shown in FIG. 3 with the exception that an adhesive 15 which forms adhesive coating 30 after a curing is disposed on semiconductor chip mounting region 46 of printed circuit board 40' and provides adhesive-overflow preventing dam 35 capable of preventing a bleed out effect that the adhesive is bleeding outside of the semiconductor chip mounting region 46.

As described above, in the method of manufacturing a ball grid array semiconductor package in accordance with a preferred embodiment of the present invention to achieve the sixth objective of the invention, there is further conducted a step of forming a dam for preventing the overflow of an adhesive constituting an adhesive coating with the view to offering high reliability in the subsequent step of electrical connection.

Figure 11A:
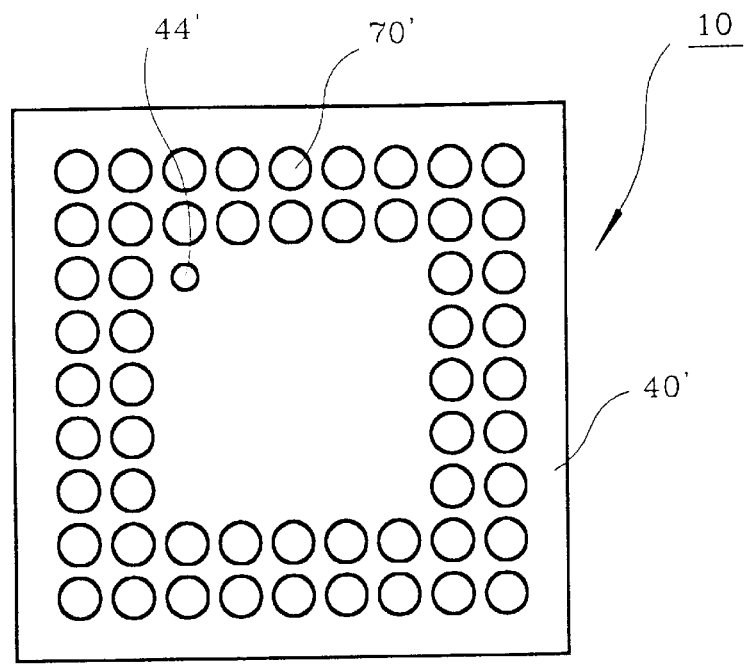
FIGS. 11a–11c are bottom views illustrating the selective position of a tag in accordance with another preferred embodiment of the present invention.
Figure 11B:
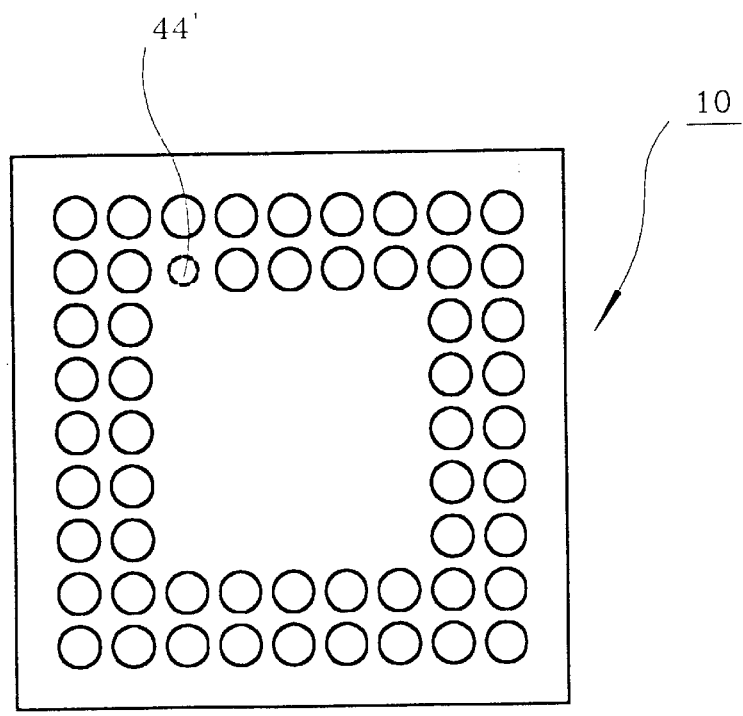
Figure 11C:
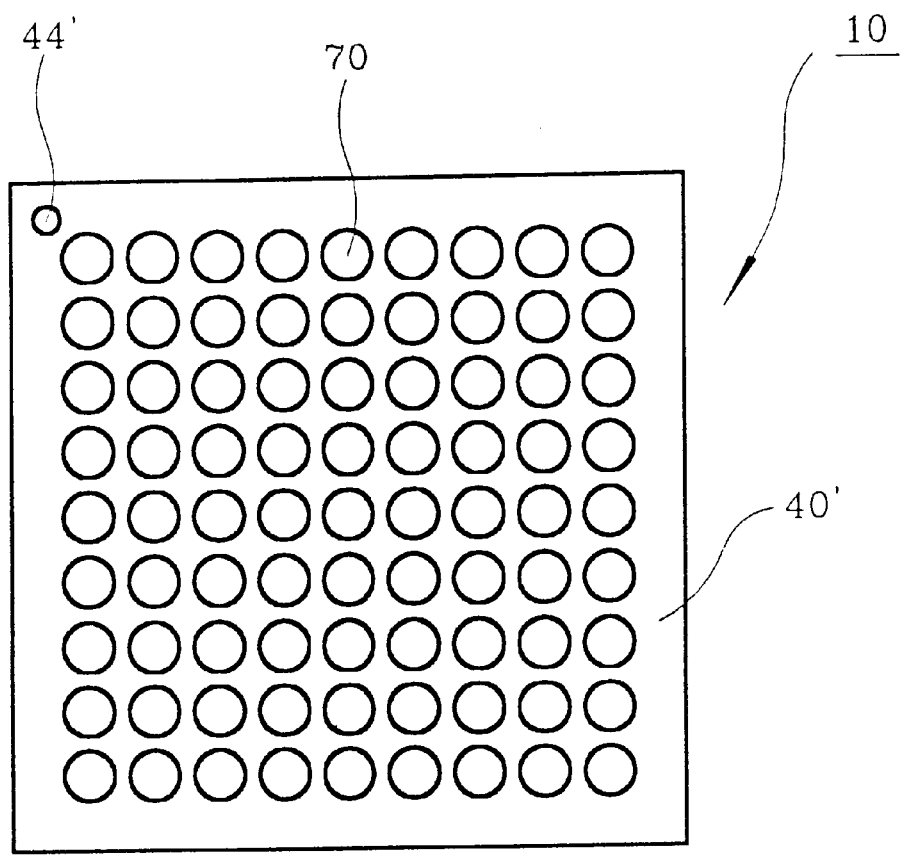

A schematic illustration of a method to attain the seventh objective of the invention is presented in FIGS. 11a–11c.

FIGS. 11a–11c are bottom views illustrating the selective position of a tag 44' in accordance with another preferred embodiment of the present invention. The tag for finding the position of a flexible circuit board strip (or unit) may be provided during or after the step of forming the flexible circuit board strip (or unit).

According to the embodiment, tag 44' is formed among a plurality of conductive ball lands 44 on the lower surface of the flexible circuit board 40' in order to find the position of a reference land. Tag 44' is of a significance because it eliminates the possible occurrence of defects caused by the dislocation of the finished semiconductor package during the step of manufacturing the semiconductor package or mounting it on a main board (not shown).

Such a tag 44' is not limited in size, but may be provided as a ball land smaller in diameter than the other conductive ball lands 44 or as omitted one among the arrayed conductive ball lands 44.

Tag 44' is also not limited in position, but may be preferably disposed at the position at a corner inside the array of conductive ball lands 44 (FIG. 11a) or at a corner outside the array of conductive ball lands 44 (FIG. 11c). It would be possible to provide the tag 44' by omitting one land out of conductive ball lands 44 inside or outside the ball land array.

Consequently, in the method of manufacturing a ball grid array semiconductor package in accordance with the preferred embodiment of the present invention to attain the seventh objective of the invention, a tag is formed during or after the step of forming the flexible circuit board strip (or unit) so that the position of the flexible circuit board strip (or unit) can be found in the manufacture of the semiconductor package or after the separation of finished package in the piece, permitting the prevention of defect occurrences during the manufacturing process.

It is thus concluded, as described above, that the method of manufacturing a ball grid array semiconductor package according to the present invention can enhance the efficiency in process and production yields as well as increasing the reliability of the finished semiconductor package.

It will be apparent to those skilled in the art that various modifications and variations can be made in the method of manufacturing a ball grid array semiconductor package of the present invention without departing from the spirit or scope of the invention. Thus, it is intended that the present invention cover the modifications and variations of this invention provided they come within the scope of the appended claims and their equivalents.

What is claimed is:

1. A method of manufacturing a ball grid array semiconductor package, comprising the steps of:

forming a flexible circuit board strip having plural circuit pattern sections including a plurality of conductive traces having bond fingers and conductive ball lands on a flexible resin film;

adhesively fixing a carrier frame onto the flexible circuit board strip by using an adhesive double-coated tape having a plurality of through holes at positions corresponding in a one to one relation with the plural circuit patterns on the flexible circuit board strip, thus exposing the circuit pattern sections;

mounting semiconductor chips having a plurality of input/output pads in the center of the respective plural circuit patterns;

electrically connecting the input/output pads of the semiconductor chips to the bond fingers of the respective circuit pattern sections;

molding a resin encapsulant section for protecting the semiconductor chips and electrical connecting means against external environments;

adhesively fusing a plurality of conductive balls provided as input/output terminals on the bottom surface of the flexible circuit board; and conducting a singulation by forming notches in the flexible resin film and the adhesive double-coated tape by use of a punch and by pressing the resin encapsulant section from the upside to remove the carrier frame and separate semiconductor packages in the piece.

2. The method as defined in claim 1, wherein the notches are formed on the bottom surface of a metal carrier frame in the step of singulation.

3. The method as defined in claim 1, wherein the outside of the notches is upwardly pressed in removing the metal carrier frame in the step of singulation.

4. The method as defined in claim 1, wherein the conductive trances between the cut-off line by the notches and the resin encapsulant section has a minimum length to provide a performance test for the semiconductor packages separated in the piece.

5. The method as defined in claim 1, wherein the notches are formed in the straight lines on four edges of a perfect square, in the form to take off four corners of the perfect square, or the combination thereof.

6. The method as defined in claim 1, wherein the carrier frame perforated with the through holes having a slanted inside wall with the upper part narrower than the lower one is used in the step of fixing the carrier frame, thereby forming multiple slanted faces in the side wall of the resin encapsulant section in the step of molding.

7. The method as defined in claim 1, wherein the resin encapsulant section is pressed from the upside thereof by means of a singulation tool having a slanted bottom surface in the step of singulation.

8. The method as defined in claim 1, wherein the through holes formed in the adhesive double-coated tape are larger in width than those disposed in the carrier frame in the step of fixing the carrier frame.

9. The method as defined in claim 8, wherein the width of the through holes in the adhesive double-coated tape is larger than that of through holes in the carrier frame by 25 to 700 μm.

10. The method as defined in claim 1, further comprising the step of:

forming flexible circuit board units including plural conductive traces having bond fingers and conductive ball lands on the flexible resin film, instead of conducting the step of forming the flexible circuit board strip; and by use of an adhesively double-coated tape and a carrier frame having a plurality of through holes at least equal in size to the circuit pattern sections on the flexible circuit board units, adhesively fixing, adhesively fixing the carrier frame to the flexible circuit board units to expose the circuit pattern sections through the through holes of the adhesive double-coated tape and their corresponding through holes of the carrier frame.

11. The method as defined in claim 10, wherein small position-securing pin holes are disposed at three corners in the outer part of each of the circuit pattern sections of the flexible circuit board units.

12. The method as defined in claim 1, further comprising the step of forming a dam for preventing an overflow of adhesive in the area between a semiconductor chip mounting region and the bond fingers on the flexible circuit board, between the steps of fixing the carrier frame and mounting the semiconductor chips.

13. The method as defined in claim 12, wherein the adhesive-overflow preventing dam is formed from a non-conductive material and disposed in the 20 to 100 μm range of height.

14. The method as defined in claim 1, further comprising the step of forming a position-finding tag on the bottom surface of the respective circuit pattern sections on the flexible circuit board during or after the step of forming the flexible circuit board strip.

15. The method as defined in claim 14, wherein the position-finding tag is formed as a land smaller in diameter than the other conductive ball lands and disposed inside or outside of one corner of an array of the conductive ball lands.

16. The method as defined in claim 14, wherein the tag is realized by omitting one ball land inside or outside of one corner of the arrayed conductive ball lands in formation of the ball lands.

17. The method as defined in claim 2, wherein the outside of the notches is upwardly pressed in removing the metal carrier frame in the step of singulation.

18. The method as defined in claim 2, wherein the conductive trances between the cut-off line by the notches and the resin encapsulant section has a minimum length to provide a performance test for the semiconductor packages separated in the piece.

19. The method as defined in claim 2, wherein the notches are formed in the straight lines on four edges of a perfect square, in the form to take off four corners of the perfect square, or the combination thereof.

* * * * *

UNITED STATES PATENT AND TRADEMARK OFFICE
CERTIFICATE OF CORRECTION

PATENT NO.    : 6,020,218                                           Page 1 of 1
DATED         : February 1, 2000
INVENTOR(S)   : Shim, Il Kwon; Ha, Sun Ho; Darveaux, Robert F.

It is certified that error appears in the above-identified patent and that said Letters Patent is hereby corrected as shown below:

Title page,
Item [75] delete:

INVENTORS:  Il Kwon Shim, Seoul; Sun Ho Ha, Kyungki-Do, both of Rep. of Korea

Insert:

INVENTORS:  Il Kwon Shim, Seoul; Sun Ho Ha, Kyungki-Do, both of Rep. of Korea; and Robert F. Darveaux, Higley, Arizona Column 5,
Line 57, delete "@".

Signed and Sealed this

Sixteenth Day of October, 2001

*Attest:*

NICHOLAS P. GODICI
*Attesting Officer*    *Acting Director of the United States Patent and Trademark Office*